March 18, 1969 J. C. BARTNIK ETAL 3,434,070

SHUNT FEED FOR INCREASING AMPLIFIER OUTPUT POWER

Filed Jan. 14, 1966

INVENTORS
JOHN C. BARTNIK
ELLSWORTH R. MOSS

BY

Stanley M. Schurgin

ATTORNEY 3,434,070

SHUNT FEED FOR INCREASING AMPLIFIER OUTPUT POWER

John C. Bartnik, Cheektowaga, and Ellsworth R. Moss, Williamsville, N.Y., assignors to Sylvania Electric Products Inc., a corporation of Delaware Filed Jan. 14, 1966, Ser. No. 520,678
U.S. Cl. 330—31 8 Claims
Int. Cl. H03f 3/04, 3/68, 1/22

ABSTRACT OF THE DISCLOSURE

An amplifier circuit having an input network tuned to provide an impedance mismatch between the input of the amplifier and its drive source to thereby cause a selected portion of the drive power to be reflected. A feed-through circuit comprising a DC blocking capacitor and an inductance are series connected between the input and output of the amplifier to provide a broadband network for shunting the reflected power to the amplifier output in a manner providing in-phase summation of the shunted power with the amplifier output power.

This invention relates generally to amplifier circuits, and more particularly to means for increasing the output power of an amplifier above the maximum output power capability of a conventional amplifier stage. The invention is especially useful in broadband, high frequency transistorized amplifiers.

A conventional technique employed to increase the output power of a radio frequency (RF) source is to cascade amplifier stages. A limit to this cascading of amplifier stages is reached, however, when the final stage is driven into saturation. At this point, maximum output power has been reached and a further increase in drive power or addition of another stage of amplification will have no effect toward increasing output power. For example, consider a transistorized RF power source intended for broadband operation at frequencies in the order of 300 mc./sec. Presently available amplifier transistors suitable for operation in this frequency range have a maximum output power capability of about 6 watts when driven to saturation. If this 6 watt output is applied to a second transistor stage, the second transistor will be driven to saturation and provide a 6 watt output, thereby being ineffective to provide a further gain in power. The next step conventionally employed to obtain increased output power is to parallel the amplifier strings and sum the parallel outputs. Although this approach provides increased output power, the direct paralleling of transistors presents the disadvantages of circuit complexity and relatively narrow band operation.

Accordingly, it is a general object of the present invention to provide improved means for increasing the output power of an amplifier.

It is a more particular object of the invention to provide improved means for increasing the output power of a broadband transistorized amplifier above the capability of a conventional amplifier stage.

It is another object of the invention to provide a broadband, high frequency, high power transistorized amplifier with a minimum of circuit complexity.

Briefly, these objects are attained by providing an impedance mismatch between the input of an amplifier and its drive source to cause a portion of the drive power to be reflected at the amplifier input terminal, and shunting the reflected power to the output of the amplifier via an inductive feed-through circuit connected between the input and the output of the amplifier in a manner providing in-phase summation of the shunted power with the amplifier output power. The invention thereby provides a shunt feed circuit whereby the drive source functions simultaneously as a driver for the amplifier and a contributor to output power. Consequently, if the drive level is such that the portion of input power not reflected is sufficient to drive the amplifier to saturation, the addition of the shunted power at the output terminal can provide a total output power well above the capability of a conventional amplifier stage.

A DC blocking capacitor is required in the feed-through circuit to isolate the amplifier input from the supply voltage source, but the inductance and capacitance values of the feed-through circuit are selected to provide a low Q, broadband network to thereby insure that the self-resonant frequency of the blocking capacitor is below the operating frequency range. Consequently, if the basic amplifier circuitry is designed to be broadband, the short path length and inductiveness of the feed-through circuit will maintain this broadband quality.

In a preferred embodiment of the invention, the shunt feed arrangement is applied to the final stage of a string of cascaded, high frequency transistor amplifiers, each connected in a common emitter configuration. The driver and output transistors are operated in saturation, and the inductive shunt circuit, connected from the base to collector of the output transistor, feeds the reflected high frequency power to the output to insure power summation over the entire instantaneous bandwidth of operation.

Other objects, features, and advantages of the invention, and a better understanding of its operation, will become apparent from the following detailed description, reference being had to the accompanying drawings, in which.

Figure 1:
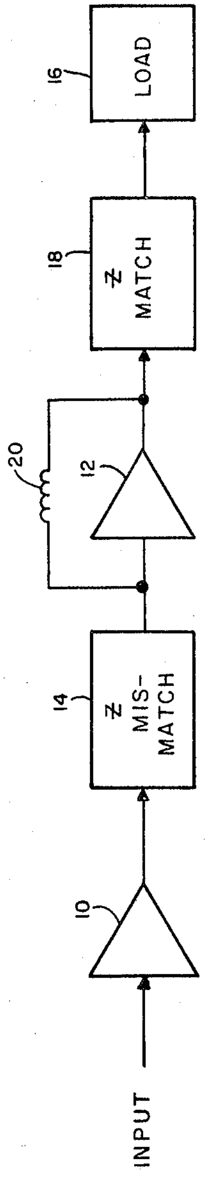
FIG. 1 is a block diagram of an amplifier circuit including the invention.

Referring to the block diagram of FIG. 1, the shunt feed arrangement of the present invention is shown as applied to the last stage of a pair of cascade connected amplifier stages 10 and 12. An unmodulated or modulated input signal is applied as a source of alternating current (AC) drive power for amplifier 10; a tuned interstage network 14 is connected between the output terminal of amplifier 10 and the input terminal of amplifier 12; and, the output of amplifier 12 is applied to a load 16 through a tuned interstage coupling circuit 18.

If the FIG. 1 circuit were a conventional power amplifier, networks 14 and 18 would both be tuned for impedance matching between stages, and the maximum power output to the load would be limited to the output of amplifier 12 when driven to saturation. In accordance with the present invention, however, interstage network 14 is tuned to provide an impedance mismatch between amplifiers 10 and 12 so that a portion of the incident AC power sampled from the output of amplifier 10 is reflected at the input of amplifier 12. Further, an inductive feed-through circuit 20 is connected from the input to output of amplifier 12 for shunting this input reflected AC power to the output of amplifier 12.

In operation, the portion of incident power not reflected at the input of amplifier 12 is used to drive that amplifier, this fraction of incident power used for amplifier drive being selected by the tuning of network 14 and preferably being sufficient to drive amplifier 12 to maximum power output. The signal processed by amplifier 12 will, of course, be phase inverted at the output. Hence, the inductance of feed-through circuit 20 is selected to shift the phase of the AC power shunted therethrough to compensate for this amplifier introduced phase shift and provide in-phase power summation at the output of the final stage. More specifically, the inductance value of feedthrough circuit 20 is adjusted to provide the required phase response to insure summation of the shunted power and amplifier 12 output power over the entire instantaneous frequency bandwidth of operation. In order to efficiently couple this increased output power to the load 16, network 18 is tuned as an impedance matching network to match the combination of the source impedance of the feedthrough circuit and the source impedance of the output of amplifier 12 with the input impedance of load 16. In this manner, the output power applied to load 16 is increased well above the capacity of amplifier 12 without shunt feed; further, the inductiveness and short path length of the feedthrough circuit and the simplicity of the shunt feed circuit arrangement make this means of increasing amplifier output power extremely compatible with the broadband operation.

To provide a clearer understanding of the application and utility of the invention, the shunt feed arrangement will now be described, with reference to FIG. 2, as embodied in a three stage transistorized amplifier circuit which has been successfully operated as a broadband RF power amplifier in the ultra high frequency range. Each stage of the amplifier comprises an NPN transistor connected in a common emitter configuration. The advantage of this configuration is the high stability achievable for a given amount of power gain. This results from the fact that the power gain of a common emitter amplifier is composed of both voltage gain and current gain, and because the internal feedback is degenerative. Further, the ratio of the output to the input impedance in a common emitter circuit is much smaller than it is in the common collector and common base configurations, thus requiring less impedance transformation in the interstage network. The resulting simplicity of the interstage network makes the common emitter circuit nearly ideal for broadband operation.

An input signal from an RF power source, represented by terminal 22 is coupled to the base of the first stage transistor 24 through a tuned impedance matching pi network 26. Base bias for transistor 24 is provided by a voltage divider comprising resistor 28 and 30 serially connected between a source of positive direct current voltage, represented by terminal 32, and ground, the junction of resistors 28 and 30 being connected to the base electrode via RF choke 34. A capacitor 36 is connected from the base of transistor 24 to ground, if necessary, for padding the trimming capacitors of network 26; although not shown, such padding capacitors are also employed when necessary on the subsequent interstage circuits.

At frequencies from 100–400 mc./sec. a well known disadvantage of the common emitter configuration is the degenerative effect of the emitter lead inductance. To reduce total emitter inductance and thus minimize the problems associated therewith, the emitter lead for transistor 24 is made as short as possible, split, and connected directly to ground. The splitting of the emitter lead also encourages separate ground paths of current flow for the input and output circuits of each stage. The foregoing procedure has been found to be quite effective in attaining the desired over-all bandwidth response.

The collector circuit of transistor 24 comprises an inductor 38*a* and resistor 40 serially connected from the collector electrode to terminal 32, which provides a source of collector supply voltage. Capacitor 42, connected from terminal 32 to ground, provides an AC bypass for inductor 38*a*, and capacitor 44 connected between terminal 32 and a second source of DC voltage, represented by terminal 46, isolates the supply voltage source at terminal 32 from the source at terminal 46.

The collector output of the first stage is coupled to the base of the second stage transistor 48 by means of a tuned three-pole interstage network 38 comprising inductors 38*a* and 38*b* and variable capacitors 38*c* and 38*d*. Capacitor 38*c* and inductor 38*b* are serially connected between the collector of transistor 24 and the base of transistor 48, and capacitor 38*d* is connected from the base of transistor 48 to ground. Capacitors 38*c* and 38*d* are tuned to provide impedance matching between transistors 24 and 48. In addition to the above mentioned circuit components, the parasitic contribution of the output stage (i.e. the base-emitter capacitance of transistor 24), and the input of the following stage, composed of an internal inductive reactance and a positive real part, form parts of the matching network.

The base bias circuit for transistor 48 comprises RF choke 50 and resistors 52 and 54 serially connected between the positive DC voltage terminal 46 and ground. The voltage divider junction of resistors 52 and 54 is connected to the base of transistor 48 via RF choke 56. The emitter of transistor 48 is connected directly to ground by a split lead for the reasons discussed above with respect to transistor 24, and the collector of transistor 48 is connected via inductor 58*a*, resistor 60 and choke 50 to a source of supply voltage at terminal 46.

The collector output of the second stage is coupled to the base of third stage transistor 62 by means of a tuned three-pole interstage network 58 comprising inductors 58*a* and 58*b* and variable capacitors 58*c* and 58*d*. Network 58 is designed similar to network 38 with the significant exception that, in accordance with the invention, capacitors 58*c* and 58*d* are tuned to provide an impedance mismatch between the second and third stage.

Since the drive power increases for successive stages of amplification, the first stage amplifier is biased for class A operation, the second stage amplifier is biased for class B operation, and the third stage is at zero bias for class C operation. Consequently, the base of transistor 62 is connected to ground via serially connected RF choke 66 and resistor 68. As with the first two stages, the transistor 62 emitter lead is split and connected directly to ground, and the third stage collector electrode is connected to the DC supply voltage source at terminal 46 through a series circuit comprising inductor 70*a*, resistor 72 and RF chokes 74 and 50. Capacitor 76 is connected from the junction of resistor 60 and choke 74 to ground to provide an AC bypass for inductors 58*a* and 70*a*.

In accordance with the invention, a feedthrough circuit 64 is connected from the input to output of the third stage. More specifically, feedthrough circuit 64 comprises a DC blocking capacitor 64*a* and an inductance 64*b* serially connected from the base to collector of transistor 62. Inductance 64*b* would comprise a coil at lower frequencies, but at UHF, it is determined by a length of wire. The DC blocking capacitor 64*a* is included to isolate the collector DC supply voltage from the base circuit of transistor 62 while providing a path for RF power flow. The values of capacitor 64*a* and inductance 64*b* are selected so that the $L/C$ ratio is very small, thereby providing a low Q, broadband network, and insuring that the self resonant frequency of the capacitor is below the intended frequency bandwidth of operation, to make the feedthrough circuit a substantially inductive circuit. Finally, the total inductance of feedthrough circuit 64 is adjusted to resonate with the collector-to-base capacitance of transistor 62 at the center frequency of the intended operating bandwidth to provide the required RF phase response to ensure power summation over the entire RF instantaneous bandwidth. In other words, feedthrough circuit 64 combines with interstage network 58 to provide an impedance matched path from the output of the second stage to the output of the third stage.

The collector output of the third stage is connected to a final output terminal 78 through an output impedance matching network 70 comprising inductors 70*a* and 70*b* and variable capacitor 70*c*. Network 70 is tuned to match the source impedance at the junction of the collector of transistor 62 and feedthrough circuit 64 with the output.

It will be noted that all stages are designed without external feedback and that the shunt feed arrangement is applied only to the final stage. Although network 64 is effectively connected between the input and output of the final stage, feedback is a secondary consideration because of the large mismatch from network 64 into the base of transistor 62 due to the mismatch tuning of network 58.

Figure 2:
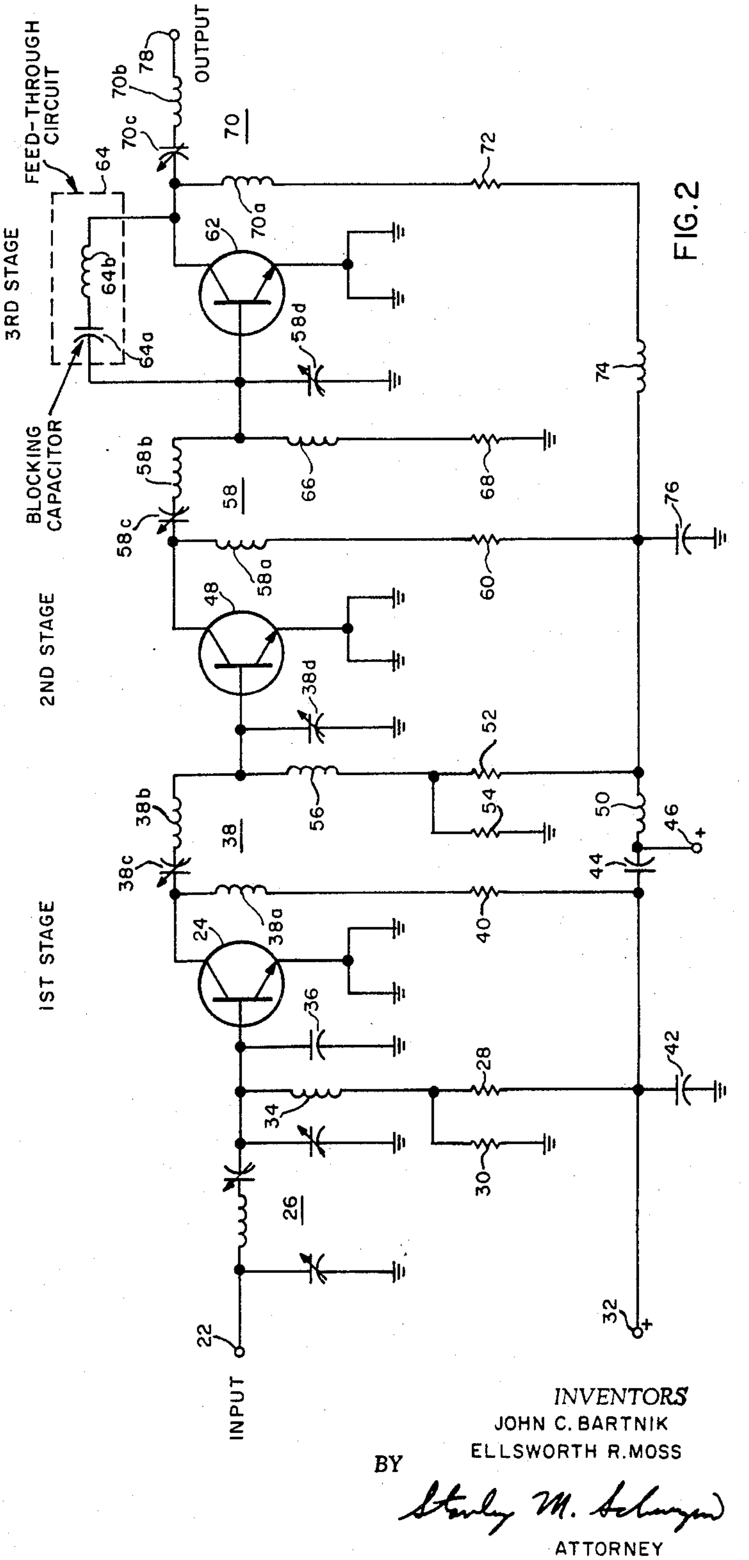
FIG. 2 is a schematic diagram of a three-stage transistorized power amplifier including the invention incorporated in the final stage.

The circuit embodiment of FIG. 2 has been successfully demonstrated, using a 2N3375 transistor in each amplifier stage, to provide, for a 1 watt input, a total RF output power of 10 watts with an instantaneous bandwidth of 100 mc. centered at any frequency between 300 and 350 mc./sec. The first stage amplifies the 1 watt input to an output level of from 2.5 to 3 watts, a power level sufficient to drive the second stage to saturation. The maximum output level at saturation for a 2N3375 transistor is from 5 to 6 watts. With an output power level from the second stage of approximately 6 watts, variable capacitors 58*c* and 58*d* are adjusted to provide a voltage standing wave ratio of 10:1 so that 75 percent of the incident power is reflected at the base of the third stage transistor. The remaining 1.5 watts is used to drive the final stage for an output power of approximately 5.5 watts. The 4.5 watts of reflected power is fed via circuit 64 to the output of the third stage where it combines with the amplifier signal for a total RF output power of 10 watts. In this instance, therefore, the output power capability of the amplifier has been nearly doubled by using shunt feed. For this specific circuit, the value of capacitor 64*a* was 0.01 $\mu$f. and the value of inductance 64*b*, which is simply a length of wire, was 0.1 $\mu$h.

While the invention has been described as embodied in transistorized circuits, the advantages thereof are also obtainable when vacuum tubes are used as the active elements. A vacuum tube embodiment of FIG. 2 would be represented by a similar circuit schematic, with vacuum tubes substituted for transistors, anode connections for collector connections, cathode for emitter connections, and grid for base connections. The circuit values would of course be modified to be compatible with the characteristics of vacuum tubes. It will also be understood that the shunt feed arrangement is suitable for use at operating frequencies other than those discussed, and with amplifier configurations other than the common emitter or common cathode type. It is applicants' intention, therefore, that the invention not be limited to what has been specifically shown and described except insofar as such limitations appear in the appended claims.

What is claimed is:

1. In combination, an amplifier having input and output terminals, a source of alternating current drive power, means connecting said source of drive power to the input terminal of said amplifier and providing an impedance mismatch between said drive power source and said amplifier, said impedance mismatch means being operative to cause a selected portion of said alternating current drive power to be reflected at the input terminal of said amplifier, and a power feed-through circuit connected from the input terminal to the output terminal of said amplifier for shunting said reflected alternating current power from the input to the output of said amplifier.

2. A circuit combination in accordance with claim 1 wherein said power feed-through circuit includes an inductance the value of which is selected to shift the phase of alternating current power shunted therethrough to provide at the output terminal of said amplifier in-phase summation of said shunted power and the output power of said amplifier over a given instantaneous frequency bandwidth of operation.

3. A circuit combination in accordance with claim 2 further including a load and an impedance matching network connected between the output terminal of said amplifier and said load, said matching network being operative to match the source impedance at said amplifier output terminal, said source impedance comprising a combination of the source impedance of said amplifier output and the source impedance of said feed-through circuit output, with the input impedance of said load.

4. A circuit combination in accordance with claim 3 further including a source of direct current supply voltage connected to the output terminal of said amplifier, and in which said feed-through circuit includes a direct current blocking capacitor serially connected with said inductance, the values of said inductance and said capacitor being selected so that said feed-through circuit is broadband and substantially inductive for a given bandwidth of operation.

5. A circuit combination in accordance with claim 1 wherein said amplifier comprises a transistor having collector, emitter and base electrodes, said base electrode being the input terminal of the amplifier, said collector being the output terminal of the amplifier, and the emitter electrode of the amplifier being connected through circuit means to a source of reference potential.

6. A circuit combination in accordance with claim 5 wherein said transistor has internal collector-to-base capacitance and said power feed-through circuit includes an inductance the value of which is selected to resonate with said collector-to-base capacitance at the center frequency of a given frequency bandwidth of operation and to shift the phase of alternating current power shunted therethrough to provide at the collector of said transistor inphase summation of said shunted power and the output power of said amplifier transistor over a given instantaneous frequency bandwidth of operation.

7. A circuit combination in accordance with claim 6 further including a source of direct current supply voltage connected to the collector of said transistor, and wherein said feed-through circuit includes a direct current blocking capacitor serially connected with said inductance, the values of said inductance and said blocking capacitor being selected so that said feed-through circuit is broadband and the self-resonant frequency of said capacitor is lower than the intended frequency bandwidth of operation, thereby making said feed-through circuit substantially inductive for said given bandwidth of operation.

8. A circuit combination in accordance with claim 7 further including a load and an impedance matching network connected between the collector of said transistor and said load, said matching network being operative to match the source impedance at the collector of said transistor, said source impedance comprising a combination of the source impedance of said transistor output and the source impedance of said feed-through circuit output, with the input impedance of said load.

References Cited

UNITED STATES PATENTS 3,230,467 1/1966 Atherton et al. ------ 330—151

JOHN KOMINSKI, *Primary Examiner.*

U.S. Cl. X.R.

330—21, 124, 151, 150